United States Patent [19]

Hausselt et al.

[11] Patent Number: 4,803,046

[45] Date of Patent: Feb. 7, 1989

[54] METHOD FOR MAKING TARGETS

[75] Inventors: Juergen Hausselt; Stephan-U. Schittny, both of Alzenau; Dieter Kaufmann, Birstein, all of Fed. Rep. of Germany

[73] Assignee: Demetron Gesellschaft Fuer Elektronik-Werkstoffe m.b.H., Hanau, Fed. Rep. of Germany

[21] Appl. No.: 85,502

[22] Filed: Aug. 14, 1987

[30] Foreign Application Priority Data

Aug. 16, 1986 [DE] Fed. Rep. of Germany ....... 3627775

[51] Int. Cl.$^4$ ................................................ B22F 3/26
[52] U.S. Cl. ........................................ 420/83; 419/27; 420/416; 420/427
[58] Field of Search .................... 419/27; 420/83, 416, 420/427

[56] References Cited

U.S. PATENT DOCUMENTS

| | | | |
|---|---|---|---|
| 4,612,047 | 9/1986 | Schmidt et al. | 420/83 |
| 4,619,697 | 10/1986 | Hijikata et al. | 419/87 |
| 4,620,872 | 11/1986 | Hijikata et al. | 420/83 |

Primary Examiner—Wayland Stallard
Attorney, Agent, or Firm—Beveridge, DeGrandi & Weilacher

[57] ABSTRACT

A method for working high-purity, mechanically strong targets containing brittle phases in the equilibrium state. First a porous body is manufactured from part of the component with a higher melting point and thereafter the porous body is impregnated with an impregnating composition corresponding to the remainder of the components required to form the ultimate composition of the target. The composition of the impregnation material must be selected in such a manner that the reaction between the impregnation material and the porous body shall produce no phases of low melting points.

14 Claims, No Drawings

METHOD FOR MAKING TARGETS

The invention concerns a method for making high-purity and mechanically strong targets of high density, especially targets composed predominantly of rare earths and transition metals, or of silicon and refractory metals, used to coat objects by cathode sputtering or by evaporation. Such targets are sometimes referred to as electron/ion-beam targets. In an equilibrium state the claimed target compositions contain high proportions of brittle phases and easily react with the ambient atmosphere and/or the crucible materials.

Using cathode sputtering and evaporation, thin films can be deposited on substrates, which have applications ranging from functional layers in electronics and in data engineering, to anti-corrosion and anti-wear protection layers, and to optical layers for decorative and heat-engineering purposes.

In cathode sputtering, an glow discharge takes place between the cathode (target) and the anode as a result of which particles of atomic size are dislodged from the target by the ions impinging thereon, and these particles then are deposited on substrates in the area of the anode.

The atmosphere for the glow discharge process is formed either of inert gases such as argon or helium, or formed of reactive gases such as oxygen, nitrogen or acetylene, all at low pressures.

When sputtering is carried out in inert gases, the target ordinarily consists of the material which is intended to form the deposited layer, whereas in reactive gas sputtering, the detached target particles will react with the reaction gas and are then deposited as a layer of the reaction product.

In the evaporation method, the target material is thermally evaporated in vacuum by the heating effect of resistance heaters or electron beams and is separated as a thin layer on the substrate.

The evaporation method and sputtering methods are well known in the art and therefore, the details of conventional steps, compositions and processes need not be recited herein but are contemplated by applicants.

The targets can be manufactured in accordance with conventional methods, such as by melting techniques with corresponding post-finishing by shaping and milling, or by powder-metallurgy by pressing and sintering corresponding powders or mixtures of powders. Details of such methods are known to those skilled in the art.

As regards target materials which, because of their compositions, are composed of substantial proportions of brittle phases, manufacturing by melting techniques presents problems because such targets exhibit cracks due to thermal stresses when cooling after casting. As a result of such stresses, the targets may break into pieces and be useless for their intended purpose. Moreover, most of the time such materials cannot be worked mechanically, i.e. machined, and as a result specifically desired target geometries are therefore precluded.

Powder-metallurgical methods present problems for those target materials containing substantial proportions of reactive components, for instance components that would react with atmospheric oxygen. Due to the large specific surface of the powders and the resultant affinity and tendency to reaction, it has been observed that high-grade targets—for instance with low oxygen contents—cannot be made by powder-metallurgy techniques.

Moreover, products made by powder-metallurgy techniques most of the time exhibit a residual open porosity which cannot be tolerated in oxygen-sensitive target materials because of the possible oxidation of the entire target.

These manufacturing problems are encountered especially in targets containing predominantly rare earths and transition metals, or silicon and refractory metals.

Accordingly, it is an object of the present invention to provide a method for making high-purity and mechanically strong targets with relatively high density, in particular targets comprising predominantly rare earths and transition metals or of silicon and refractory metals. The targets are employed to coat objects by cathode sputtering or evaporation in accordance with well understood principles. The targets of the present invention in their equilibrium state composition contain high proportions of brittle phases as a result of their chemical composition and easily react with the ambient atmosphere and/or the crucible materials.

It is a further object of the present invention to provide targets that can be mechanically worked and are essentially free of pores.

In attaining the above and other objects of the invention, one feature resides in initially making a porous body from at least a portion of the higher melting point components of the desired final target composition. It is Ordinarily prepared as powder in bulk and/or by pressing and/or by sintering. However, it can also be made from wire mesh, wire wool, fleece, perforated plate, as well as by mechanically working dense materials. Thereafter, the porous body is impregnated with an impregnating material of low melting point that is prepared from the remainder of the components used to form the ultimate target composition. The composition of the low melting impregnating material is selected in accordance with the invention so that when the impregnating material reacts with the porous body, no siginificant phases of lower melting points, other than the impregnating material, will occur.

Preferably, in carrying out the process of the invention, the components of the target composition that are reactive at the ambient atmosphere and/or with the crucible material are added to the impregnation material.

The process is carried out in conventional ovens or furnaces. The reaction conditions for such ovens are also well understood in this art. The duration of the impregnation step is selected to be sufficiently short through a corresponding oven program so that only negligible proportions of brittle equilibrium phases arise. Thus, through the selection of time and treating oven conditions, a control can be achieved over the formation of brittle equilibrium phases.

Impregnation of the porous body by the impregnating material can be carried out in several ways, as by introducing from above, from below, by dipping or by pressurized impregnation in vacuum, under an inert or a reducing atmosphere. The forces ensuring complete impregnation of the porous body by the impregnating material are the capillary forces acting within the pores and the mutual wetting of the substances present in the overall composition.

The impregnation material used in accordance with the present invention is a low melting component of the target composition or a low melting alloy (i.e. an eutectic), that contains the remainder of the required components for the overall composition of the target. The composition of the impregnation material must be so selected that no phases are formed as a result of the reaction of the impregnating component with the porous body that would exhibit a significantly lower melting point than the impregnation material. The duration of the impregnation step together with its parameters (heating, holding at the impregnation temperature, cooling) must be selected to be sufficiently short so that on one hand there will be complete wetting of surfaces and filling of the porous body, while on the other hand the reaction between the impregnation material and the porous body, during which brittle phases would be produced, shall be negligibly small. In this way, control over the formation of undesirable brittle phases is obtained.

The overall composition of the target when entirely impregnated is determined by the composition of the porous body and by the composition of the impregnation material as well as by the pore volume of the porous body. Accordingly, the pore volume of the porous body must be accurately set using, for instance, sifted powder fractions and corresponding compacting conditions.

It has been surprisingly determined in accordance with the present invention that this manufacturing method when applied to brittle and reactive target materials results in compact, pore-free and mechanically strong molded parts. The products produced by the method of the present invention meet the sputtering requirements and permit mechanical working thereof to obtain complex geometries. Products produced by the present invention are characterized by a very low content of gases and contaminants. Moreover, the impregnation procedure of this invention enables an additional purification stage, in addition to the degassing in a vacuum or a reducing atmosphere. That is to say, any non-melted impurities, for instance oxides, in the impregnation material, following impregnation remain outside the impregnated material as slag and therefore only purified melt enters the capillaries of the porous body.

The terms "rare earth element", "transition metal" and "refractory metal" are used herein in their well understood meanings as exhibited by standard texts, such as Hackh's Chemical Dictionary.

The method of the present invention is further illustrated in the following examples.

EXAMPLE 1

To manufacture a highly pure, dense, mechanically strong sputtering target provided with magneto-optic storage layers from an iron-terbium alloy with a content of 25% atomic terbium, there is first prepared a porous iron body by sintering under vacuum from the purest obtainable iron powder (1,000° C./1 h/$10^{-4}$ Pa).

The grain size distribution of the iron powder must be so selected by sifting that under the sintering conditions above set forth (1000° C./1 h/$10^{-4}$ Pa) a porosity of 54.3% will be obtained. This porosity is obtained by using a fraction in the 50–150 micron particle size with a linear RRS distribution (DIN 66145).

In this case, the composition of the impregnation material corresponds to the eutectic composition of the iron-terbium system (72% atomic terbium, m.p. 847° C.), whereby upon complete impregnation, the desired overall composition of 25% atomic terbium, remainder iron, is achieved.

The impregnation procedure is carried out by deposition impregnation in a vacuum oven. The required deposition plate of the impregnation material can be made by melting in a vacuum induction furnace. Alloys of the eutectic composition are mechanically strong and sufficiently ductile. The equipment used, e.g. the oven, are conventional.

After the vacuum furnace has been loaded, the impregnation procedure is carried out for 3 minutes at 900° C./$10^{-6}$ Pa.

EXAMPLE 2

By extending the impregnation time to 20 minutes at 900° C. and $10^{-4}$ Pa, there takes place, beyond the impregnation and wetting, an intense reaction between the impregnation material and the iron body. As a result, a high structural proportion of brittle phases arises in the final composition. Due to the brittleness similar to that encountered in the casting manufacture, the target is mechanically weak and breaks into several pieces.

If, on the other hand, the impregnation time is limited to 3 minutes as in Example 1, then no significant reaction takes place after the impregnation and accordingly the product exhibits good mechanical strength and even complex geometries can be made by cutting.

In these target materials, the gas contents obtained are less than 500 ppm.

EXAMPLE 3

In order to make a high-purity, mechanically strong tantalum silicide ($TaSi_2$) sputtering target, a porous tantalum body which is intended to act as the body to be impregnated is manufactured by sintering high-purity, agglomerated tantalum powder in vacuum (1,480° C./1 h/$10^{-4}$ Pa). It was found that with a corresponding selection of the particle size distribution of between 105 and 210 microns at the above sintering conditions the required porosity of 69% can be achieved, so that using an eutectic impregnation material of 99% atomic silicon, 1% atomic tantalum, $T_s = 1,385°$ C., with complete impregnation the desired overall composition of 66.6% atomic silicon is achieved.

This impregnation is carried out by immersion, in a vacuum of $10^{-4}$, and at 1,450° C. for 2 minutes.

The above described impregnation procedures can be used as guidelines and adapted to all materials based on rare earths and transition metals or refractory metals and silicon to arrive at suitable conditions in order to make high-purity, dense, mechanically strong targets.

Further variations and modifications of the present invention will be apparent to those skilled in the art from the foregoing and are intended to be encompassed by the claims appended hereto.

The German priority application P 36 27 775.4 is relied on and incorporated herein by reference.

We claim:

1. A method for making a high-purity, high density and mechanically-strong target, adapted for use to coat an object by cathode sputtering or by evaporation, comprising:

selecting a desired composition for said final target from a plurality of components, some of said components having a relatively higher melting temperature and some of said components having a relatively lower melting temperature;

forming a porous body of relatively high melting point from at least a portion of said components having a relatively higher melting temperature;

forming an impregnation material of relatively low melting point from the remaining portion of said components;

impregnating said porous body with said impregnation material such that the reaction of said impregnation material with said porous body produces no substantial amounts of a phase having a melting point lower than said components and produces only negligible proportions of a phase having brittleness in the equilibrium state.

2. The method of claim 1 wherein said target is an electron/ion beam target.

3. The method of claim 1 wherein said target comprises a material selected from the groups consisting of the rare earth elements and transition metal elements, or silicon and a refractory metal.

4. The method of claim 1, wherein the components reactive to the ambient atmosphere and/or the crucible materials are contained in the impregnation material.

5. A target material produced by the method of claim 1.

6. The method of claim 1 wherein said impregnating step comprises a duration time of less than 5 minutes.

7. The method of claim 1 wherein said impregnating step comprises a temperature in the range of 900 to 1450 degrees Celsius.

8. A method for making a high-purity, high-density and mechanically-strong target, adapted for use to coat an object by cathode sputtering or by evaporation, comprising:

selecting a composition for said final target from a plurality of components, some of said components having a relatively higher melting temperature and some of said components having a relatively lower melting temperature;

forming a porous body of relatively high melting point from at least a portion of said components having a relatively higher melting temperature;

forming an impregnation material of relatively low melting point from the remaining portion of said components;

selecting a composition for said impregnation material which produces no substantial amounts of a phase having a melting point lower than said components;

impregnating said porous body with said impregnation material; and selecting a time duration and a furnace condition for said impregnating step which produces only negligible proportions of a phase having brittleness in the equilibrium state.

9. The method of claim 8 wherein said target is an electron/ion beam target.

10. The method of claim 8 wherein said target comprises a material selected from the groups consisting of the rare earth elements and transition metal elements, or silicon and refractory metal.

11. The method of claim 8 wherein the components reactive to the ambient atmosphere and/or the crucible materials are contained in said impregnation material.

12. The method of claim 8 wherein said duration time is less than 5 minutes.

13. The method of claim 8 whrein said furnace condition comprises a temperature in the range of 900 to 1450 degrees Celsius.

14. A target material produced by the method of claim 8.

* * * * *